(12) United States Patent
Tamamushi et al.

(10) Patent No.: US 11,315,793 B2
(45) Date of Patent: Apr. 26, 2022

(54) ETCHING METHOD AND PLASMA PROCESSING APPARATUS

(71) Applicant: TOKYO ELECTRON LIMITED, Tokyo (JP)

(72) Inventors: Gen Tamamushi, Miyagi (JP); Kazuya Nagaseki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/674,461

(22) Filed: Nov. 5, 2019

(65) Prior Publication Data
US 2020/0144031 A1 May 7, 2020

(30) Foreign Application Priority Data

Nov. 5, 2018 (JP) .............................. JP2018-208005
Oct. 9, 2019 (JP) .............................. JP2019-185832

(51) Int. Cl.
| | |
|---|---|
| *H01L 21/306* | (2006.01) |
| *H01L 21/3065* | (2006.01) |
| *H01J 37/32* | (2006.01) |
| *H01L 21/3213* | (2006.01) |
| *H01J 37/30* | (2006.01) |

(Continued)

(52) U.S. Cl.
CPC ...... *H01L 21/3065* (2013.01); *H01J 37/3007* (2013.01); *H01J 37/32174* (2013.01); *H01J 37/32449* (2013.01); *H01J 37/32568* (2013.01); *H01J 37/32935* (2013.01); *H01L 21/30621* (2013.01); *H01L 21/32136* (2013.01); *H01J 37/3053* (2013.01); *H01J 2237/3341* (2013.01); *H01L 21/67069* (2013.01); *H01L 21/67253* (2013.01)

(58) Field of Classification Search
CPC ..... C09G 1/02; H01L 21/304; H01L 21/3212; H01L 21/30625; H01L 21/02024; B24B 37/00; C09K 3/14
USPC ..................................... 438/693; 51/307–309
See application file for complete search history.

(56) References Cited

U.S. PATENT DOCUMENTS

| | | | |
|---|---|---|---|
| 2008/0242086 A1* | 10/2008 | Matsumaru ....... | H01J 37/32009 438/680 |
| 2011/0139748 A1* | 6/2011 | Donnelly .......... | H01J 37/32146 216/37 |

(Continued)

FOREIGN PATENT DOCUMENTS

JP 2012-079886 A 4/2012

*Primary Examiner* — Duy Vu N Deo
(74) *Attorney, Agent, or Firm* — Weihrouch IP

(57) ABSTRACT

An etching method is performed in a state where a substrate is placed on a substrate support provided in a chamber of a plasma processing apparatus. In the etching method, radio-frequency power is supplied to generate plasma from a gas in the chamber. Subsequently, a negative DC voltage is applied to a lower electrode of the substrate support during the supplying of the radio-frequency power to etch the substrate with positive ions from plasma. Subsequently, the applying of the negative DC voltage to the lower electrode and the supplying of the radio-frequency power are stopped to generate negative ions. Subsequently, a positive DC voltage is applied to the lower electrode in a state where the supply of the radio-frequency power is stopped to supply the negative ions to the substrate.

23 Claims, 6 Drawing Sheets

(51) Int. Cl.
 *H01L 21/67* (2006.01)
 *H01J 37/305* (2006.01)

(56) References Cited

U.S. PATENT DOCUMENTS

2013/0049592 A1* 2/2013 Yeom ................ H01J 37/32706
 315/111.21
2016/0293386 A1* 10/2016 Chen ................. H01J 37/32467
2017/0250056 A1* 8/2017 Boswell ............ H01J 37/32174

* cited by examiner

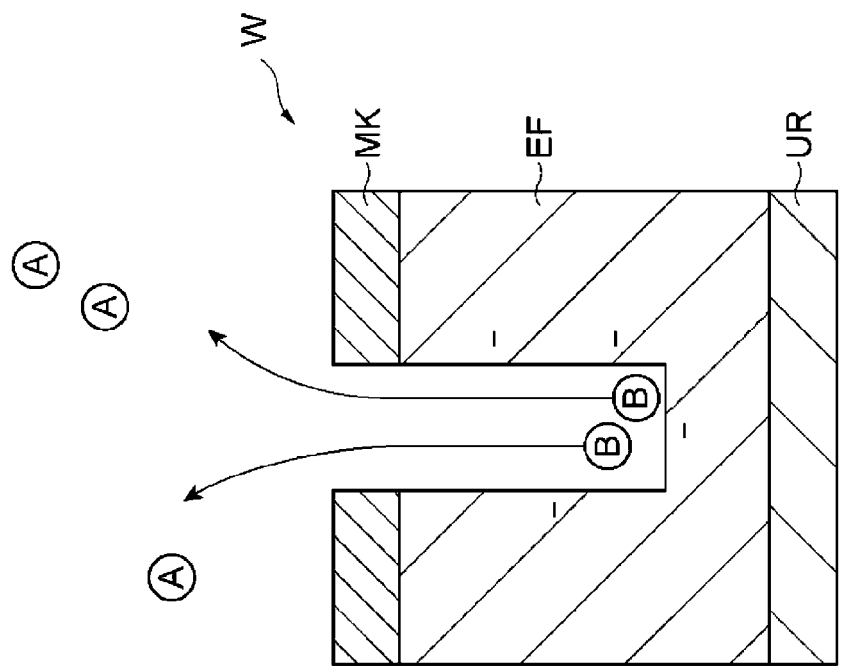
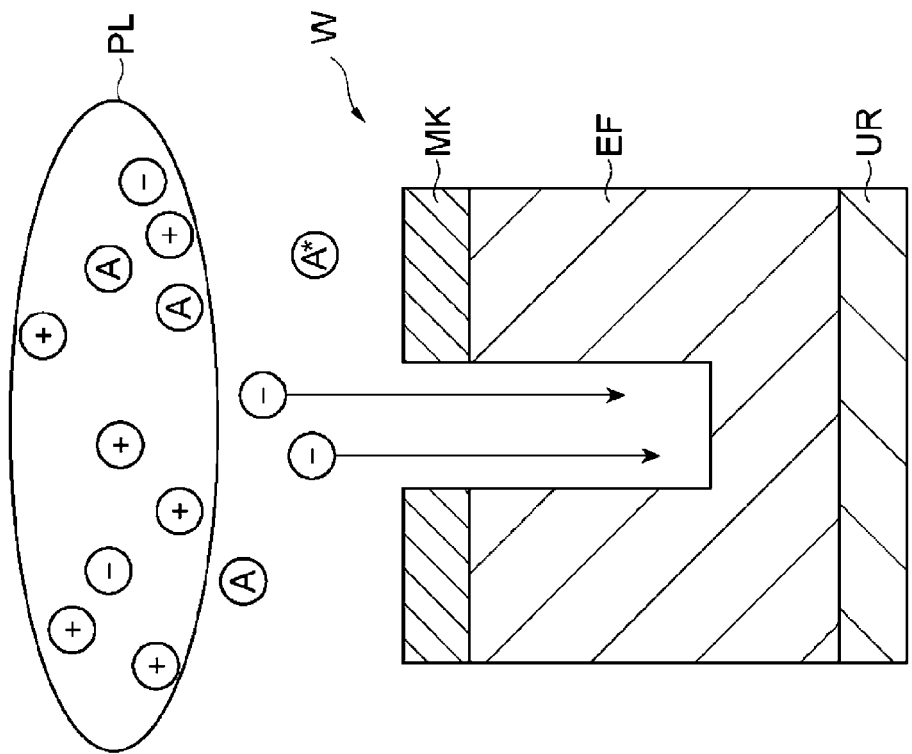
FIG. 6A
FIG. 6B

ETCHING METHOD AND PLASMA PROCESSING APPARATUS

CROSS-REFERENCE TO RELATED APPLICATION

This application is based on and claims priority from Japanese Patent Application Nos. 2018-208005 and 2019-185832, filed on Nov. 5, 2018 and Oct. 9, 2019, respectively, with the Japan Patent Office, the disclosures of which are incorporated herein in their entireties by reference.

TECHNICAL FIELD

The present disclosure relates to an etching method and a plasma processing apparatus.

BACKGROUND

A plasma processing apparatus used in a plasma etching of a substrate includes a chamber and a substrate support. The substrate support includes a lower electrode and is provided in the chamber. Plasma is generated from the gas in the chamber where the substrate is placed on the substrate support for etching. The substrate is etched by the positive ions from the plasma to form openings in the substrate.

The substrate is charged as the etching of the substrate with the positive ions progressed. In a state where the substrate is charged, the amount of positive ions supplied into the openings decreases. As a result, the etching rate may be reduced. A shape abnormality may also occur in the openings formed in the substrate.

In the technique described in Japanese Patent Laid-Open Publication No. 2012-079886, a positive DC voltage is applied from a power source to a lower electrode in order to reduce the positive charge amount of a substrate. Subsequently, the application of the DC voltage to the lower electrode is stopped. Subsequently, a negative DC voltage is applied from a power supply to the lower electrode. As a result, positive ions are drawn into the substrate and etching is performed. Thereafter, the application of the DC voltage to the lower electrode is stopped. In the technique described in Japanese Patent Laid-Open Publication No. 2012-079886, the application of the positive DC voltage to the lower electrode, the stop of the application of the DC voltage to the lower electrode, the application of the negative DC voltage to the lower electrode, and the stop of the application of the DC voltage to the lower electrode are repeated. The radio-frequency power that generates plasma is continuously supplied when the application of the positive DC voltage to the lower electrode, the stop of the application of the DC voltage to the lower electrode, the application of the negative DC voltage to the lower electrode, and the stop of the application of the DC voltage to the lower electrode are repeated.

SUMMARY

In an embodiment, an etching method performed in a plasma processing apparatus is provided. The etching method is performed in a state in which a substrate is placed on a substrate support provided in a chamber of the plasma processing apparatus. The etching method includes supplying radio-frequency power to generate plasma from a gas in the chamber. The etching method further includes applying a negative DC voltage to a lower electrode of the substrate support during execution of the supply of radio-frequency power in order to etch the substrate with positive ions from plasma. The etching method further includes stopping the application of the negative DC voltage to the lower electrode and the supply of the radio-frequency power in order to generate negative ions. The etching method further includes applying a positive DC voltage to the lower electrode in a state where the supply of radio-frequency power is stopped in order to supply negative ions to the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6A is a diagram illustrating the state of plasma and a substrate in a period P4 in the timing chart of FIG. 3, and FIG. 6B is a diagram for explaining step ST5 of the etching method illustrated in FIG. 1.

DETAILED DESCRIPTION

Figure 1:
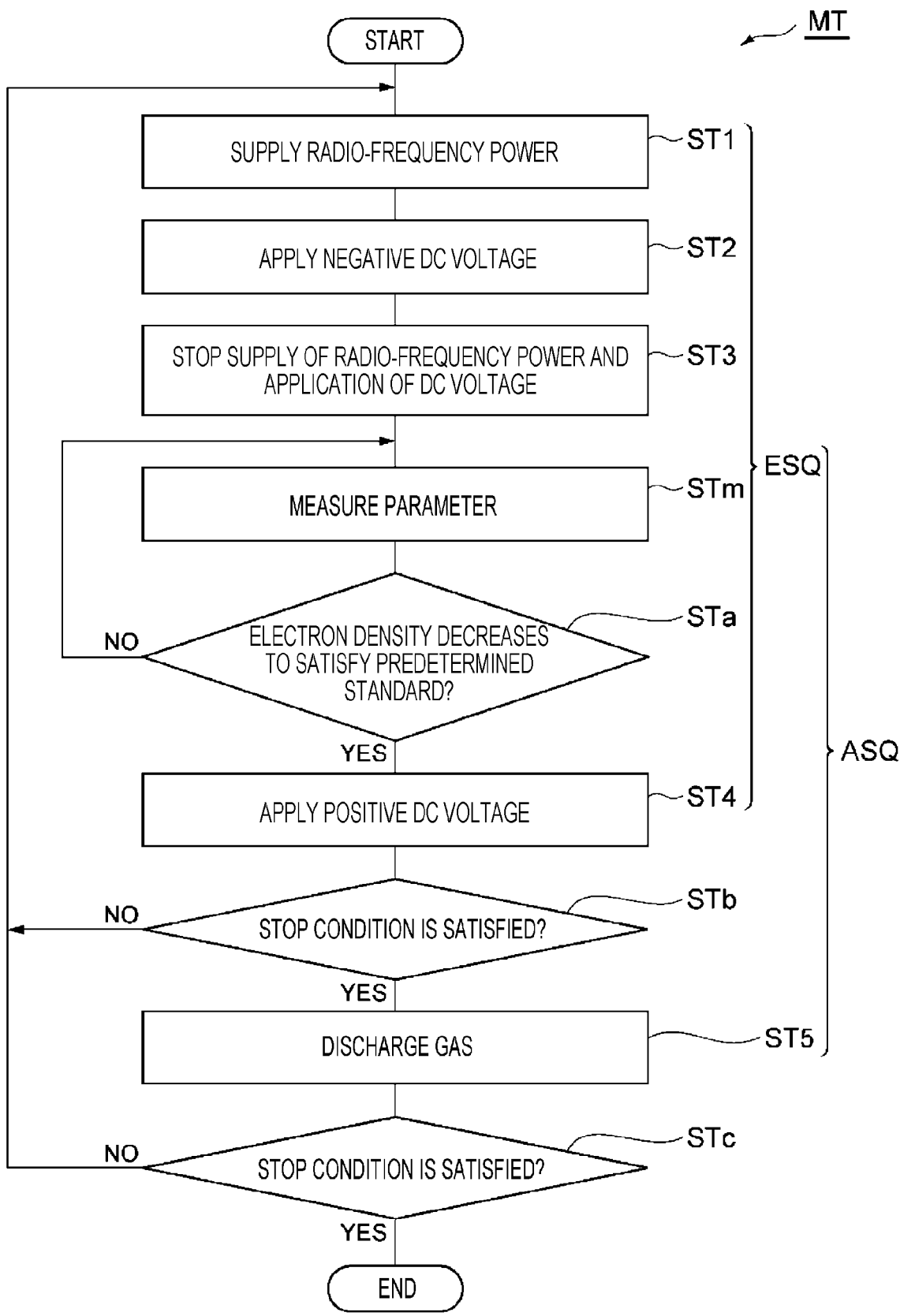
FIG. 1 is a flowchart illustrating an etching method according to an embodiment.

In the following detailed description, reference is made to the accompanying drawings, which form a part thereof. The illustrative exemplary embodiments described in the detailed description, drawings, and claims are not meant to be limiting. Other exemplary embodiments may be utilized, and other changes may be made without departing from the spirit or scope of the subject matter presented here.

Various exemplary embodiments will be described below.

In an embodiment, an etching method performed using a plasma processing apparatus is provided. The etching method is performed in a state in which a substrate is placed on a substrate support provided in the chamber of the plasma processing apparatus. The etching method includes supplying radio-frequency power to generate plasma from a gas in the chamber. The etching method further includes applying a negative DC voltage to a lower electrode of the substrate support during the execution of the supply of radio-frequency power in order to etch the substrate with positive ions from plasma. The etching method further includes stopping the application of the negative DC voltage to the lower electrode and the supply of the radio-frequency power in order to generate negative ions. The etching method further includes applying a positive DC voltage to the lower electrode in a state where the supply of radio-frequency power is stopped in order to supply negative ions to the substrate.

In the above embodiment, a negative DC voltage is supplied to the lower electrode in a state where plasma is generated by the supply of radio-frequency power. As a result, positive ions collide with the substrate so as to etch the substrate. Subsequently, the supply of the radio-frequency power and the application of the DC voltage to the lower electrode are stopped. Although the amount of negative ions generated is small in a state where radio-frequency power is supplied, negative ions are efficiently generated by electrons which are attached to chemical species in the gas when the supply of radio-frequency power is stopped. Subsequently, a positive DC voltage is applied to the lower electrode in a state where the supply of radio-frequency power is stopped. As a result, negative ions are supplied to the substrate. According to the above embodiment, the negative ions decrease the positive charge amount of the substrate. Also, the substrate is etched using both positive ions and negative ions. Therefore, the etching efficiency is improved.

In an embodiment, the etching method may further include exhausting a gas from the interior space of the chamber. The discharging step is executed after one or more executions of an etching sequence including supplying radio-frequency power, applying a negative DC voltage, stopping, and applying a positive DC voltage. At the time of executing the discharging step, the supply of the radio-frequency power is stopped and the application of the DC voltage to the lower electrode is stopped.

In an embodiment, another sequence may be repeated that includes one or more executions of the etching sequence and the discharging step.

In an embodiment, the discharging step may be executed for 10 μsec or more in the execution period of the other sequence. In the embodiment, etching byproducts are more reliably discharged. As a result, the etching efficiency of the substrate is further improved.

In an embodiment, the time length of the execution period of the discharging step may be increased as the number of executions of the other sequence increases. In the embodiment, as the depth of the opening formed in the substrate increases, the time length of the execution period of the discharging step is increased. Therefore, etching byproducts are more reliably discharged.

In an embodiment, a parameter representing an electron density in the chamber may be measured during execution of the stopping step. The step of applying the positive DC voltage may be started when it is determined from the parameter that the electron density in the chamber is decreased to satisfy a predetermined standard. The decrease in electron density during the stopping step reflects an increase in the amount of negative ions. Therefore, according to the embodiment, the step of applying the positive DC voltage is started when it is determined that the negative ions are sufficiently generated.

In an embodiment, in the stopping step, the application of the negative DC voltage to the lower electrode may be stopped before the supply of the radio-frequency power is stopped. According to the embodiment, an abnormal discharge is more reliably prevented.

In another embodiment, a plasma processing apparatus is provided. The plasma processing apparatus includes a chamber, a substrate support, a radio-frequency power source, a power supply unit, and a controller. The substrate support has a lower electrode and is provided in the chamber. The radio-frequency power source is configured to supply radio-frequency power to generate plasma from a gas in the chamber. The power supply unit is configured to generate a positive DC voltage and a negative DC voltage. The power supply unit is electrically connected to the lower electrode. The controller is configured to control the radio-frequency power source and the power supply unit. The controller is configured to execute a first control, a second control, a third control, and a fourth control. The first control includes controlling the radio-frequency power source to supply radio-frequency power to generate plasma from the gas in the chamber. The second control includes controlling the power supply unit so as to apply a negative DC voltage to the lower electrode of the substrate support during the supply of the radio-frequency power in order to etch the substrate with positive ions from the plasma. The third control includes controlling the power supply unit and the radio-frequency power source to stop the application of the negative DC voltage to the lower electrode and the supply of the radio-frequency power in order to generate negative ions. The fourth control includes controlling the power supply unit so as to apply a positive DC voltage to the lower electrode in a state where the supply of radio-frequency power is stopped in order to supply negative ions to the substrate.

In an embodiment, the plasma processing apparatus may further include an exhaust device connected to the chamber. The controller may be configured to further execute a fifth control. The fifth control includes controlling the exhaust device to exhaust a gas from the internal space of the chamber. The fifth control is executed after one or more executions of the etching control sequence including the first control, the second control, the third control, and the fourth control. When the fifth control is executed, the supply of radio-frequency power is stopped, and the application of the DC voltage to the lower electrode is stopped.

In an embodiment, the controller may repeatedly execute another control sequence including one or more executions of the etching control sequence and the fifth control.

In an embodiment, the fifth control may be executed for 10 μsec or more in the execution period of the other control sequence.

In an embodiment, the controller may increase the time length of the execution period of the fifth control as the number of executions of the other control sequence increases.

In an embodiment, the plasma processing apparatus may further include a measuring device. The measuring device measures a parameter representing the electron density in the chamber during execution of the third control. The controller may start the execution of the fourth control when it is determined from the parameter that the electron density in the chamber is decreased to satisfy a predetermined standard.

In an embodiment, in the third control, the controller may control the power supply unit to stop applying the negative DC voltage to the lower electrode before stopping the supply of the radio-frequency power.

Various embodiments will now be described in detail with reference to the drawings. Further, in the respective drawings, the same or corresponding parts will be denoted by the same symbols.

Figure 2:
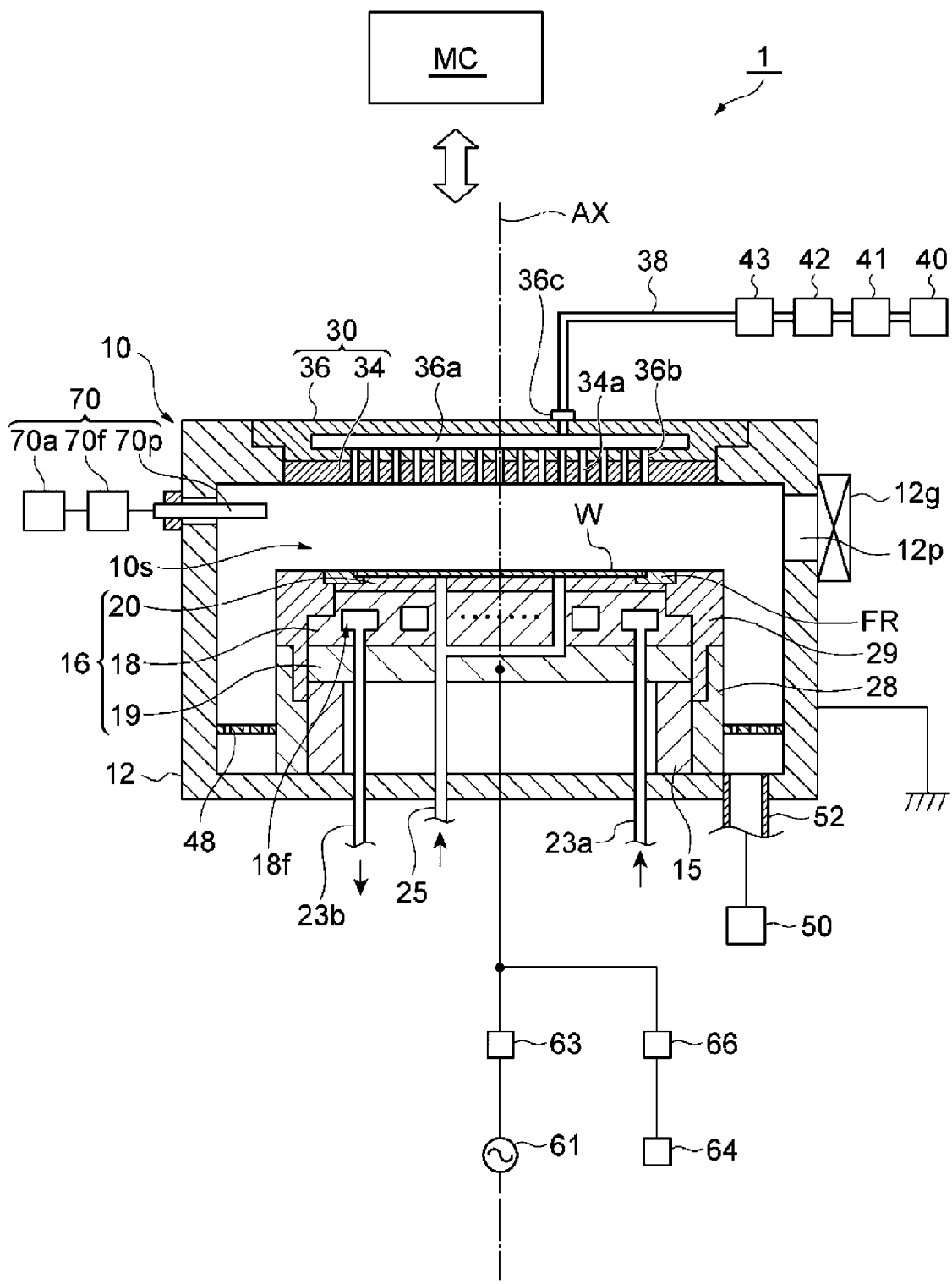
FIG. 2 is a diagram schematically illustrating a plasma processing apparatus according to an embodiment.

FIG. 1 is a flowchart illustrating an etching method according to an embodiment. The etching method illustrated in FIG. 1 (hereinafter, referred to as a "method MT") is performed using a plasma processing apparatus. FIG. 2 is a diagram schematically illustrating a plasma processing apparatus according to an embodiment. The plasma processing apparatus 1 illustrated in FIG. 2 may be used to execute the method MT.

The plasma processing apparatus 1 is a capacitively coupled plasma processing apparatus. The plasma processing apparatus 1 includes a chamber 10. The chamber 10 provides an internal space 10s therein. In the embodiment, the chamber 10 includes a chamber body 12. The chamber body 12 has a substantially cylindrical shape. The internal space 10s is provided in the chamber body 12. The chamber body 12 is made of, for example, aluminum. The chamber body 12 is electrically grounded. A plasma-resistant film is formed on the inner wall surface of the chamber body 12, that is, the wall surface that defines the internal space 10s. The film may be a ceramic film such as a film formed by anodization or a film formed from yttrium oxide.

A passage 12p is formed in the side wall of the chamber body 12. A substrate W passes through the passage 12p when being transferred between the internal space 10s and the outside of the chamber 10. A gate valve 12g is provided along the side wall of the chamber body 12 so as to open and close the passage 12p.

A substrate support, that is, a support stage 16 is provided in the chamber 10. The support stage 16 is configured to support the substrate W placed thereon. The substrate W has a substantially disk shape. The support stage 16 is supported by a support body 15. The support body 15 extends upward from the bottom of the chamber body 12. The chamber body 15 has a substantially cylindrical shape. The support body 15 is made of an insulating material such as quartz.

The support stage 16 has a lower electrode 18. The support stage 16 may further include an electrostatic chuck 20. The support stage 16 may further include an electrode plate 19. The electrode plate 19 is made of a conductive material such as aluminum and has a substantially disk shape. The lower electrode 18 is provided on the electrode plate 19. The lower electrode 18 is made of a conductive material such as aluminum and has a substantially disk shape. The lower electrode 18 is electrically connected to the electrode plate 19.

A flow path 18f is formed in the lower electrode 18. The flow path 18f is a flow path for the heat exchange medium. As for the heat exchange medium, a liquid refrigerant or a refrigerant that cools the lower electrode 18 by vaporization thereof (e.g., chlorofluorocarbon) is used. A circulation device of the heat exchange medium (e.g., a chiller unit) is connected to the flow path 18f. The circulation device is provided outside the chamber 10. A heat exchange medium is supplied to the flow path 18f from the circulation device through a pipe 23a. The heat exchange medium supplied to the flow path 18f is returned to the circulation device through a pipe 23b.

The electrostatic chuck 20 is provided on the lower electrode 18. When the substrate W is processed in the internal space 10s, the substrate W is placed on the electrostatic chuck 20 and held by the electrostatic chuck 20. The electrostatic chuck 20 has a main body and electrodes. The main body of the electrostatic chuck 20 is made of a dielectric such as aluminum oxide or aluminum nitride. The main body of the electrostatic chuck 20 has a substantially disk shape. The electrostatic chuck 20 includes a substrate placement region and a focus ring mounting region. The substrate placement region is a region having a substantially disk shape. The upper surface of the substrate placement region extends along a horizontal plane. An axis AX that includes the center of the substrate placement region and extends in the vertical direction substantially coincides with the center axis of the chamber 10. The substrate W is placed on the upper surface of the substrate placement region when processed in the chamber 10.

The focus ring mounting region extends in the circumferential direction to surround the substrate mounting region. A focus ring FR is mounted on the upper surface of the focus ring mounting region. The focus ring FR has a ring shape. The substrate W is disposed in a region surrounded by the focus ring FR. That is, the focus ring FR surrounds the edge of the substrate W placed on the substrate placement region of the electrostatic chuck 20. The focus ring FR is made of, for example, silicon or silicon carbide.

The electrode of the electrostatic chuck 20 is provided in the main body of the electrostatic chuck 20. The electrode of the electrostatic chuck 20 is a film formed from a conductor. A DC power supply is electrically connected to the electrode of the electrostatic chuck 20. When a DC voltage is applied from a DC power source to the electrode of the electrostatic chuck 20, an electrostatic attraction is generated between the electrostatic chuck 20 and the substrate W. Due to the generated electrostatic attraction, the substrate W is attracted to the electrostatic chuck 20 and held by the electrostatic chuck 20.

The plasma processing apparatus 1 may further include a gas supply line 25. The gas supply line 25 supplies a heat transfer gas from a gas supply mechanism, for example, He gas, between the upper surface of the electrostatic chuck 20 and the back surface (lower surface) of the substrate W.

The plasma processing apparatus 1 may further include a tubular portion 28 and an insulating portion 29. The tubular portion 28 extends upward from the bottom of the chamber body 12. The tubular portion 28 extends along the outer periphery of the support body 15. The tubular portion 28 is made of a conductive material and has a substantially cylindrical shape. The tubular portion 28 is electrically grounded. The insulating portion 29 is provided on the tubular portion 28. The insulating portion 29 is made of an insulating material. The insulating portion 29 is made of ceramic such as, for example, quartz. The insulating portion 29 has a substantially cylindrical shape. The insulating portion 29 extends along the outer periphery of the electrode plate 19, the outer periphery of the lower electrode 18, and the outer periphery of the electrostatic chuck 20.

The plasma processing apparatus 1 further includes an upper electrode 30. The upper electrode 30 is provided above the support stage 16. The upper electrode 30 closes an upper opening of the chamber body 12. The upper electrode 30 is supported on the upper portion of the chamber body 12.

The upper electrode 30 includes a top plate 34 and a support body 36. The lower surface of the top plate 34 defines an internal space 10s. A plurality of gas discharge holes 34a are formed in the top plate 34. Each of the plurality of gas discharge holes 34a penetrates the top plate 34 in the plate thickness direction (vertical direction). Although the top plate 34 is not limited, the top plate 34 is formed from, for example, silicon. Alternatively, the top plate 34 may have a structure in which a plasma-resistant film is provided on the surface of an aluminum member. The film may be a ceramic film such as a film formed by anodization or a film formed from yttrium oxide.

The support body 36 detachably supports the top plate 34. The support body 36 is made of a conductive material such as, for example, aluminum. A gas diffusion chamber 36a is provided inside the support body 36. A plurality of gas holes 36b extend downward from the gas diffusion chamber 36a. The plurality of gas holes 36b communicate with the plurality of gas discharge holes 34a, respectively. A gas introduction port 36c is formed in the support body 36. The gas introduction port 36c is connected to the gas diffusion chamber 36a. A gas supply pipe 38 is connected to the gas introduction port 36c.

A gas source group 40 is connected to the gas supply pipe 38 via a valve group 41, a flow rate controller group 42, and a valve group 43. The gas source group 40, the valve group 41, the flow rate controller group 42, and the valve group 43 constitute a gas supply. The gas source group 40 includes a plurality of gas sources. The plurality of gas sources include one or more gas sources used in etching methods according to various embodiments. Each of the valve group 41 and the valve group 43 includes a plurality of valves (e.g., open/close valves). The flow rate controller group 42 includes a plurality of flow rate controllers. Each of the plurality of flow controllers in the flow controller group 42 is a mass flow controller or a pressure control type flow controller. Each of the plurality of gas sources of the gas source group 40 is connected to the gas supply pipe 38 via a corresponding valve of the valve group 41, a corresponding flow rate controller of the flow rate controller group 42, and a corresponding valve of the valve group 43. The plasma processing apparatus 1 may supply the gas from one or more gas sources selected from the plurality of gas sources of the gas source group 40 to the internal space 10s at individually adjusted flow rates.

A baffle member 48 is provided between the tubular portion 28 and the side wall of the chamber body 12. The baffle member 48 may be a plate-like member. The baffle member 48 may be configured by coating, for example, a plate made of aluminum with a ceramic such as yttrium oxide. The baffle member 48 has a plurality of through holes. Below the baffle member 48, an exhaust pipe 52 is connected to the bottom of the chamber body 12. An exhaust device 50 is connected to the exhaust pipe 52. The exhaust device 50 includes a pressure controller such as an automatic pressure control valve and a vacuum pump such as a turbo molecular pump, and may reduce the pressure in the internal space 10s.

The plasma processing apparatus 1 further includes a radio-frequency power source 61. The radio-frequency power source 61 is a power source that generates radio-frequency power for plasma generation. The frequency of the radio-frequency power is not limited, but is a frequency within a range of 27 to 100 MHz, for example, 40 MHz or 60 MHz. The radio-frequency power source 61 is connected to the lower electrode 18 through a matcher 63 and the electrode plate 19 in order to supply radio-frequency power to the lower electrode 18. The matcher 63 has a matching circuit that matches the output impedance of the radio-frequency power source 61 with the impedance on the load side (lower electrode 18 side). Further, the radio-frequency power source 61 may not be electrically connected to the lower electrode 18, and may be connected to the upper electrode 30 via the matcher 63.

The plasma processing apparatus 1 further includes a power supply unit 64. The power supply unit 64 is configured to generate a DC voltage applied to the lower electrode 18. The power supply unit 64 is configured to generate a negative DC voltage and a positive DC voltage. The power supply unit 64 is electrically connected to the lower electrode 18. In an embodiment, the power supply unit 64 is connected to an electrical path that connects the matcher 63 and the electrode plate 19 to each other via a low-path filter 66.

In the plasma processing apparatus 1, a gas is supplied to the internal space 10s. In addition, radio-frequency power is supplied to excite gas in the internal space 10s. As a result, plasma is generated in the internal space 10s. The substrate W is processed by chemical species such as ions and/or radicals from the generated plasma.

In an embodiment, the plasma processing apparatus 1 may further include a measuring device 70. The measuring device 70 is configured to measure a parameter representing the electron density in the chamber 10. In an example, the measuring device 70 is a plasma absorption probe. In the example, the measuring device 70 includes a network analyzer 70a, a high-pass filter 70f, and a probe 70p. The probe 70p extends from the outside of the chamber 10 to the inside of the chamber 10. The network analyzer 70a is connected to the probe 70p through the high-pass filter 70f. The network analyzer 70a supplies a weak power electromagnetic wave signal to the probe 70p while changing its frequency, and acquires an S11 parameter from the reflected signal returned from the probe 70p. The network analyzer 70a specifies the electron density in the chamber 10 from the frequency corresponding to the minimum peak of the S11 parameter in the frequency characteristic of the S11 parameter. The specified electron density is used by a controller MC (to be described later) as a parameter representing the electron density.

The measuring device 70 is not limited to a plasma absorption probe. In another example, the measuring device 70 may be an emission spectroscopic analyzer. In the example, the measuring device 70 specifies the electron density in the chamber 10 from the plasma emission intensity. In yet another example, the measuring device 70 may be a device that specifies the electron density in the chamber 10 using laser light.

The plasma processing apparatus 1 further includes a controller MC. The controller MC is a computer that includes a processor, a storage device, an input device, a display device, and the like, and controls the respective units of the plasma processing apparatus 1. Specifically, the controller MC executes a control program stored in the storage device, and controls the respective units of the plasma processing apparatus 1 based on recipe data stored in the storage device. A process designated by the recipe data is executed in the plasma processing apparatus 1 by the control of the controller MC. The etching method according to various embodiments may be executed in the plasma processing apparatus 1 by controlling the respective units of the plasma processing apparatus 1 by the controller MC.

Figure 3:
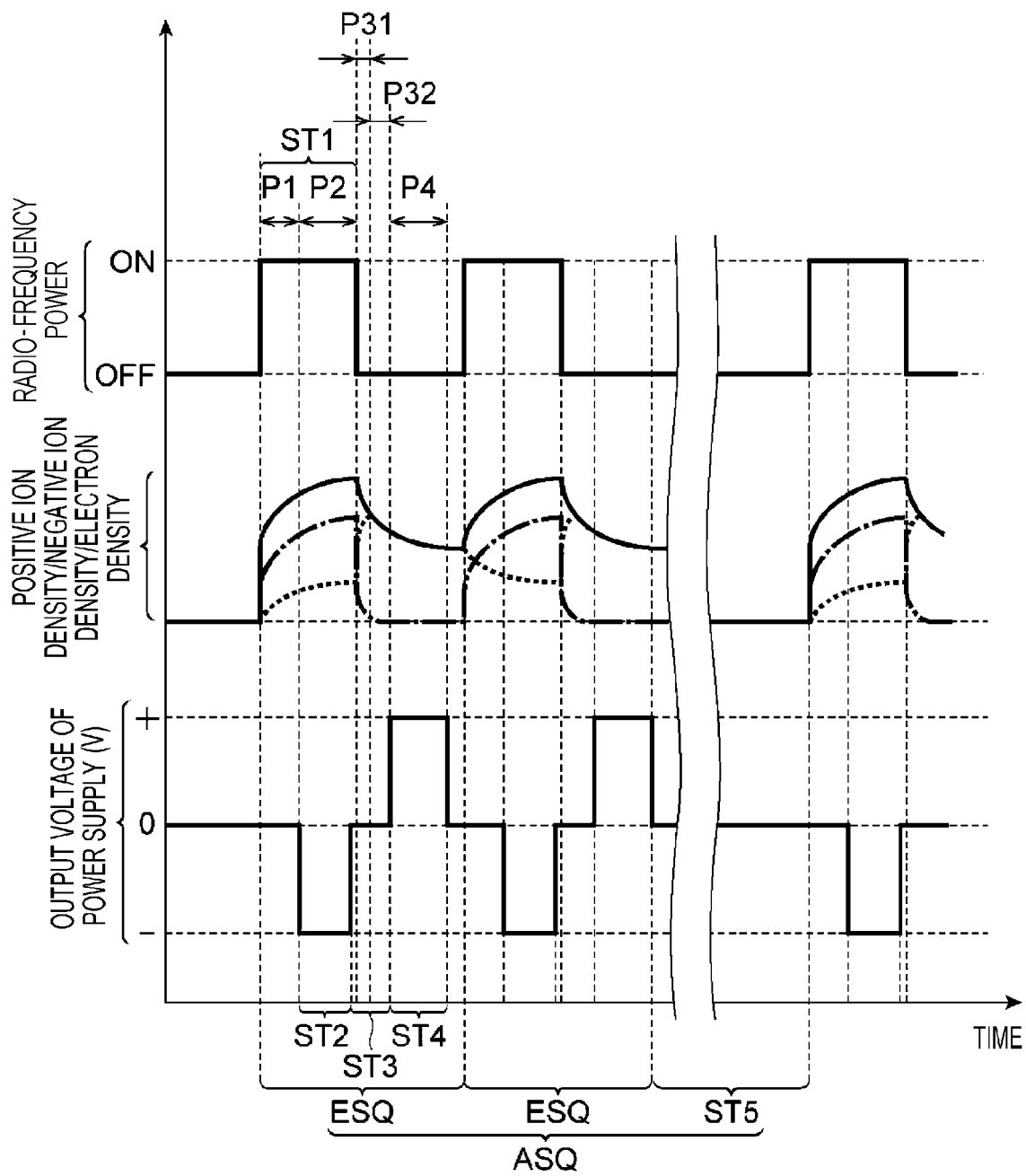
FIG. 3 is a timing chart of an example related to the etching method illustrated in FIG. 1.

Hereinafter, a method MT will be described with reference to FIGS. 1 and 3. FIG. 3 is a timing chart of an example related to the etching method illustrated in FIG. 1. In FIG. 3, the vertical axis represents radio-frequency power, positive ion density, negative ion density, electron density, and output voltage of the power supply unit 64. In FIG. 3, the fact that the radio-frequency power is ON indicates that the radio-frequency power is supplied for plasma generation, and the fact that the radio-frequency power is OFF indicates that the supply of the radio-frequency power is stopped (afterglow state). In the middle part of the timing chart in FIG. 3, the solid line represents the positive ion density, the alternate long and short dash line represents the electron density, and the dotted line represents the negative ion density.

Figure 4A:
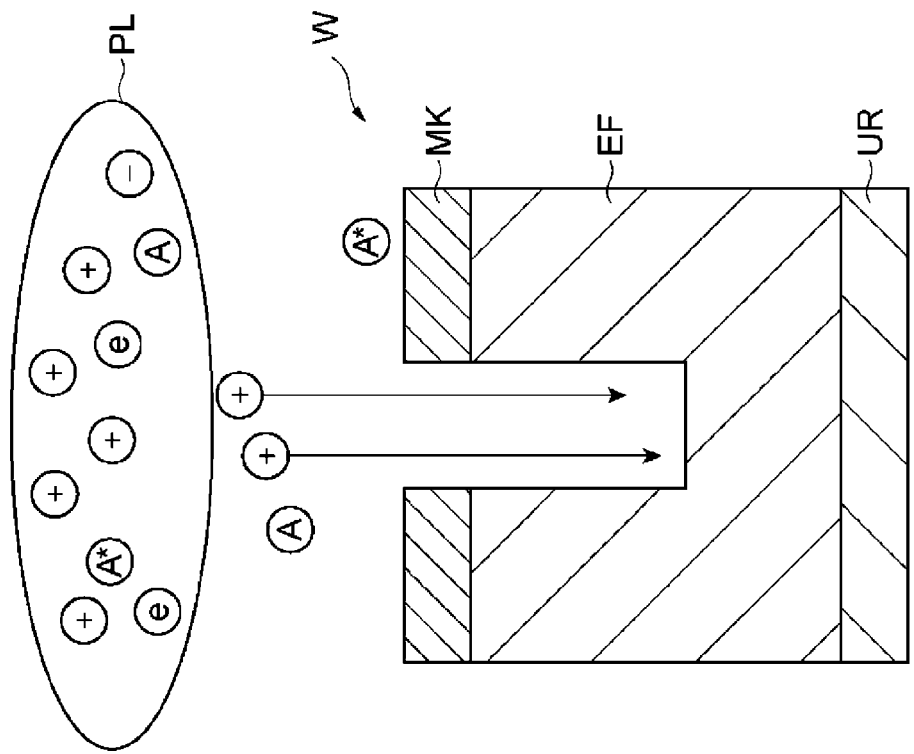
FIG. 4A is a diagram illustrating the state of plasma and a substrate in a period P1 in the timing chart of FIG. 3.

Further, reference is also made to FIGS. 4A to 6B. FIG. 4A is a diagram illustrating the state of plasma and a substrate in a period P1 in the timing chart of FIG. 3, and FIG. 4B is a diagram illustrating the state of plasma and a substrate in a period P2 in the timing chart of FIG. 3. FIG. 5A is a diagram illustrating the state of plasma and a substrate in a period P31 in the timing chart of FIG. 3, and FIG. 5B is a diagram illustrating the state of plasma and a substrate in a period P32 in the timing chart of FIG. 3. FIG. 6A is a diagram illustrating the state of plasma and a substrate in a period P4 in the timing chart of FIG. 3, and FIG. 6B is a diagram for explaining a step ST5 of the etching method illustrated in FIG. 1. In the figures, a circle surrounding "+," a circle surrounding "−," a circle surrounding "e," a circle surrounding "A," and a circle surrounding "A*" represent a positive ion, a negative ion, an electron, an atom or a molecule, and a radical, respectively. Hereinafter, the method MT will be described by taking, as an example, a case where the plasma processing apparatus 1 is used in the execution. Further, in the following description, control of the respective units of the plasma processing apparatus 1 by the controller MC will also be described.

The method MT is executed in a state where the substrate W placed on the support stage 16. The substrate W is held by the electrostatic chuck 20 on the support stage 16. In an example, the substrate W includes a base region UR, a film EF, and a mask MK. The film EF is provided on the base region UR. The film EF is a film that is etched in the method MT. The mask MK is provided on the film EF. The mask MK provides an opening on the film EF In the method MT, the pattern of the mask MK is transferred to the film EF. That is, an opening is formed in the film EF in the method MT.

In the method MT, step ST1 is performed. In the step ST1, radio-frequency power is supplied to the lower electrode 18 (or the upper electrode 30) in order to generate plasma from the gas in the chamber 10. The gas may be continuously supplied into the chamber 10 during the execution of the method MT. The radio-frequency power is supplied in the period P1 and the period P2, as illustrated in FIG. 3. The period P1 and the period P2 are execution periods of the step ST1.

The controller MC executes the first control in order to execute the step ST1. In the first control, the controller MC controls the gas supply to supply gas into the chamber 10. In the first control, the controller MC controls the exhaust device 50 so as to set the pressure in the chamber 10 to a designated pressure. Further, in the first control, the controller MC controls the radio-frequency power source 61 so as to supply radio-frequency power to the lower electrode 18 (or the upper electrode 30).

As illustrated in FIG. 4A, the plasma PL generated in the step ST1 includes positive ions, negative ions, electrons, atoms or molecules, and radicals. In the plasma PL generated in the step ST1, the amount of negative ions is relatively small.

Figure 4B:
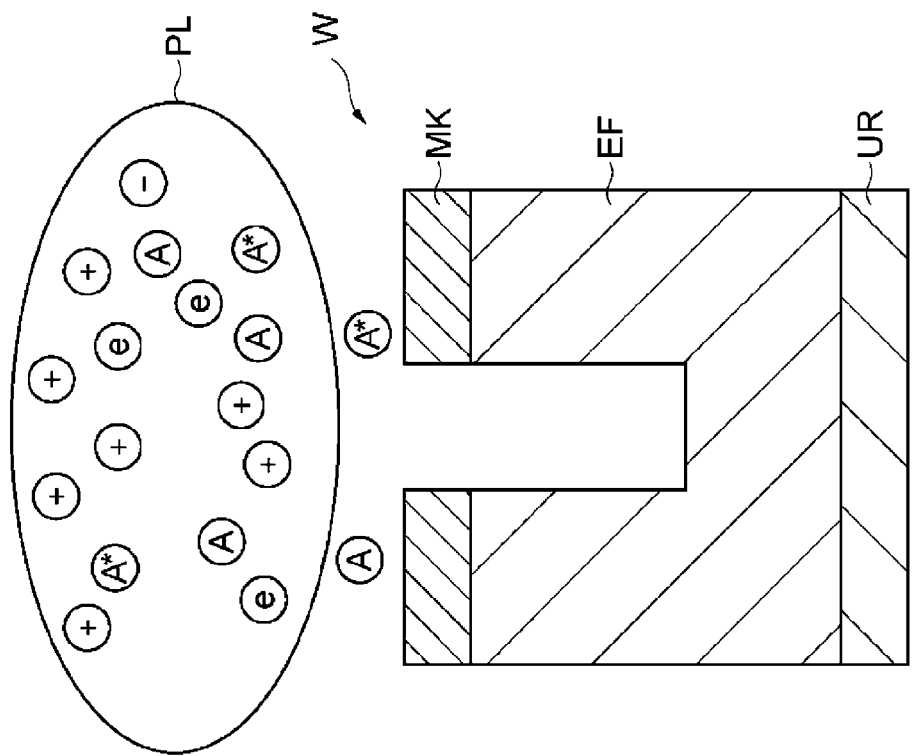
FIG. 4B is a diagram illustrating the state plasma and a substrate in a period P2 in the timing chart of FIG. 3.

Step ST2 is executed during the execution of the step ST1. That is, the step ST2 is executed during the supply of radio-frequency power for generating plasma. In the step ST2, as illustrated in FIG. 4B, a negative DC voltage is applied to the lower electrode 18 in order to etch the substrate W (i.e., the film EF) with positive ions from the plasma PL generated in the step ST1.

The controller MC executes the second control in order to execute the step ST2. In the second control, the controller MC controls the power supply unit 64 so as to apply a negative DC voltage to the lower electrode 18.

Figure 5A:
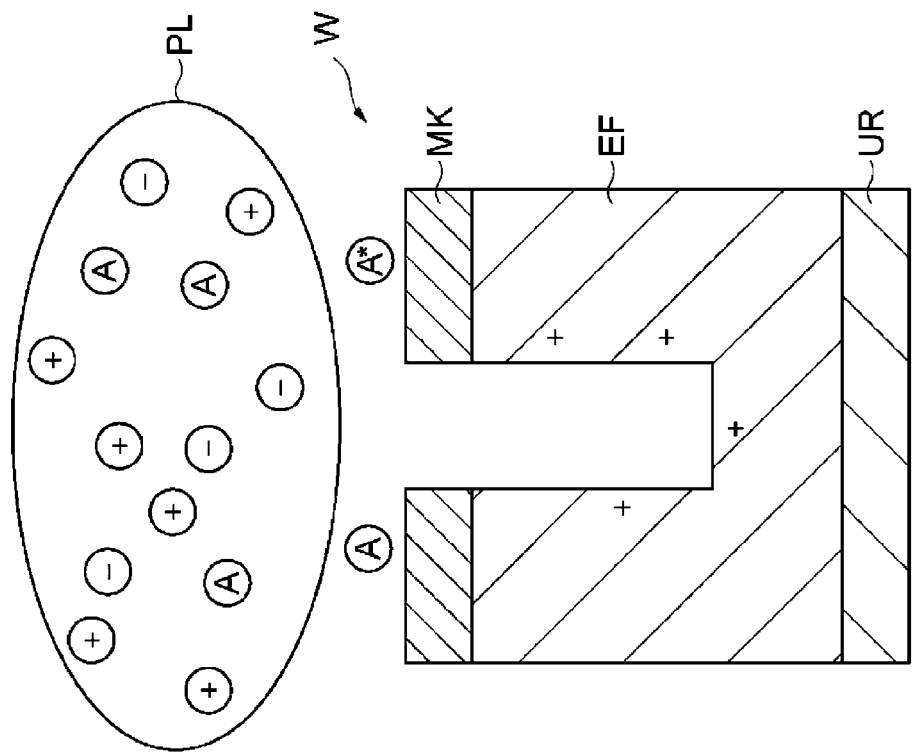
FIG. 5A is a diagram illustrating the state of plasma and a substrate in a period P31 in the timing chart of FIG. 3.

When the step ST2 is executed, positive ions collide with the substrate W and etch the substrate W. In the step ST2, since positive ions are supplied to the substrate W, the substrate W is charged with a positive charge as illustrated in FIG. 5A. In FIG. 5A, the symbol "+" in the substrate W indicates that the substrate W is charged with a positive charge.

Subsequently, step ST3 is executed. In the step ST3, application of the negative DC voltage to the lower electrode 18 is stopped in order to generate negative ions. Further, in the step ST3, the supply of radio-frequency power is stopped.

The controller MC executes the third control in order to execute the step ST2. In the third control, the controller MC controls the power supply unit 64 so as to apply a negative DC voltage to the lower electrode 18. Further, in the third control, the controller MC controls the radio-frequency power source 61 to stop supplying radio-frequency power. Also, the gas supply may continuously supply gas to the chamber 10 from the step ST1. The exhaust device 50 may continuously adjust the pressure in the chamber 10 from the step ST1.

In the step ST3 according to an embodiment, the application of the negative DC voltage to the lower electrode may be stopped before the supply of the radio-frequency power is stopped. In the third control of the embodiment, the controller MC may control the power supply unit 64 so as to stop the application of the negative DC voltage to the lower electrode 18 before stopping the supply of the radio-frequency power to the radio-frequency power source 61. According to the embodiment, an abnormal discharge is more reliably prevented.

In the period immediately after the start of the step ST3 (i.e., the period P31 in FIG. 3), the plasma PL includes positive ions, negative ions, electrons, atoms or molecules, and radicals as illustrated in FIG. 5A. In the plasma PL, the number of negative ions is relatively small.

In an embodiment, step STm is performed during execution of the step ST3. In the step STm, the above-described parameter representing the electron density in the chamber 10 is measured by the measuring device 70. The parameter measured by the measuring device 70 is given to the controller MC.

In the subsequent step STa, it is determined from the parameter by the controller MC whether the electron density in the chamber 10 is decreased so as to satisfy a predetermined standard. For example, when the electron density becomes smaller than a threshold value, it is determined that the electron density in the chamber 10 is decreased so as to satisfy a predetermined standard. Further, the decrease in the electron density during the step ST3 reflects an increase in the amount of negative ions in the chamber 10.

When it is determined in the step STa that the electron density in the chamber 10 is not decreased so as to satisfy a predetermined standard, the step ST3 is continued. That is, the execution of the third control by the controller MC continues. Meanwhile, when it is determined in the step STa that the electron density in the chamber 10 is decreased so as to satisfy a predetermined standard, the step ST3 ends and the process proceeds to step ST4. That is, when it is determined from the parameter that the electron density in the chamber 10 is decreased so as to satisfy a predetermined standard, the controller MC ends the third control and starts executing the fourth control.

Figure 5B:
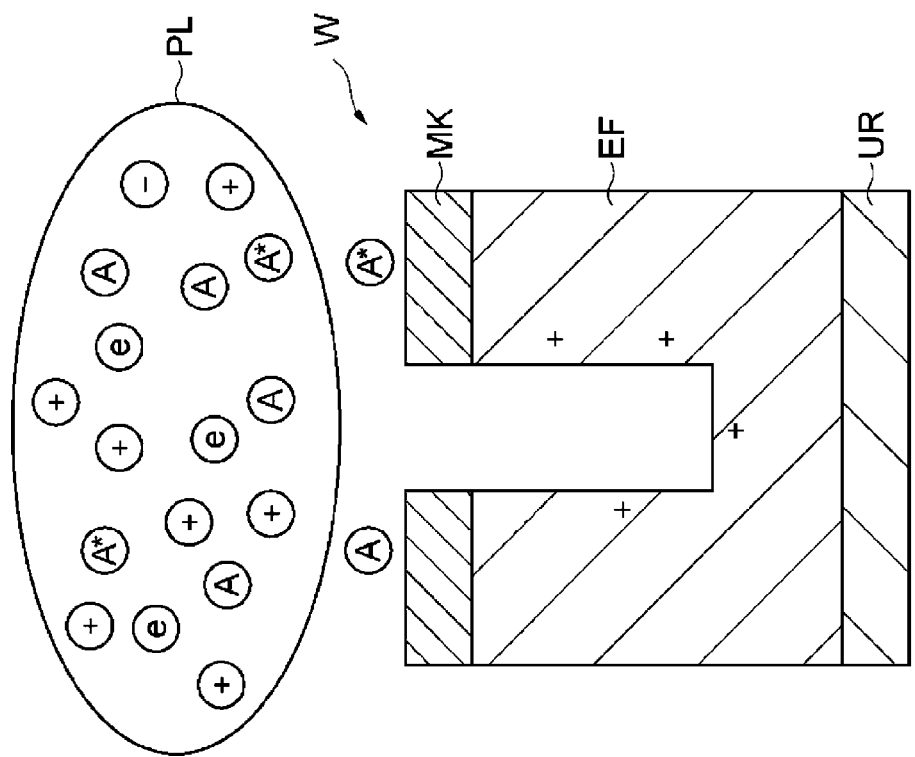
FIG. 5B is a diagram illustrating the state plasma and a substrate in a period P32 in the timing chart of FIG. 3.

During the execution of the step ST3, electrons are bonded to chemical species such as atoms, molecules, or radicals in the chamber 10 to generate negative ions. At the end of the step ST3 or a period immediately before the step ST3 (i.e., the period P32 in FIG. 3), sufficient negative ions are generated in the chamber 10 as illustrated in FIG. 5B.

In an embodiment, the step STm and the step STa may be omitted. In the embodiment, the step ST3 (and the third control) may be ended after a predetermined time has elapsed from the start time. The predetermined time is determined in advance as a time necessary for sufficient generation of negative ions in the chamber 10 after the start of the step ST3.

The step ST4 is performed in the period P4 after execution of the step ST3. In the step ST4, in order to supply the negative ions generated in the step ST3 to the substrate W, a positive DC voltage is applied to the lower electrode 18 in a state where the supply of radio-frequency power is stopped.

The controller MC executes the fourth control in order to execute the step ST4. In the fourth control of the embodiment, the controller MC controls the power supply unit 64 to apply a positive DC voltage to the lower electrode 18 in a state where the supply of radio-frequency power to the radio-frequency power source 61 is stopped. Also, the gas supply may continuously supply a gas to the chamber 10 from the step ST1. The exhaust device 50 may continuously adjust the pressure in the chamber 10 from the step ST1.

In the step ST4, since a positive DC voltage is applied to the lower electrode 18, negative ions are attracted to the substrate W, as illustrated in FIG. 6A. The negative ions collide with the substrate W and etch the substrate W (i.e., the film EF). Negative ions also reduce the amount of positive charges on the substrate W.

As described above, in the method MT, a negative DC voltage is supplied to the lower electrode 18 in a state where plasma is generated by supplying radio-frequency power. As a result, positive ions collide with the substrate W and etch the substrate W. Subsequently, the supply of the radio-frequency power and the application of the DC voltage to the lower electrode are stopped. Although the amount of negative ions generated is small in a state where radio-frequency power is supplied, negative ions are efficiently generated by electrons which are attached to chemical species in the gas when the supply of radio-frequency power is stopped. Subsequently, a positive DC voltage is applied to the lower electrode 18 in a state where the supply of radio-frequency power is stopped. As a result, negative ions are supplied to the substrate W. In the method MT, negative ions reduce the amount of positive charges on the substrate. Also, the substrate W is etched using both positive ions and negative ions. Therefore, the etching efficiency is improved.

In an embodiment, an etching sequence ESQ including the step ST1, the step ST2, the step ST3, and the step ST4 is executed one or more times. In the embodiment, the controller MC executes the etching control sequence including the first control, the second control, the third control, and the fourth control one or more times. When the etching sequence ESQ is executed a plurality of times, the repetition frequency of the etching sequence ESQ may be 10 kHz or more and 500 kHz or less. The repetition frequency of the etching sequence ESQ may be 50 kHz or more and 400 kHz or less. Further, the frequency may be greater than 400 kHz.

When the etching sequence ESQ is performed a plurality of times, the method MT further includes step STb. In the step STb, it is determined whether the stop condition is satisfied. The stop condition is satisfied when the etching sequence ESQ (or the etching control sequence) is performed a predetermined number of times. When it is determined in the step STb that the stop condition is not satisfied, the etching sequence ESQ (or the etching control sequence) is performed.

In an embodiment, when it is determined in the step STb that the stop condition is satisfied, the step ST5 is performed. In the step ST5, the gas is exhausted from the internal space of the chamber 10 by the exhaust device 50. In the step ST5, the supply of radio-frequency power by the radio-frequency power source 61 is stopped, and the application of the DC voltage to the lower electrode 18 by the power supply unit 64 is stopped.

The controller MC performs the fifth control in order to execute the step ST5. In the fifth control, the controller MC controls the exhaust device 50 so as to discharge a gas from the internal space of the chamber 10. In the fifth control, the controller MC controls the radio-frequency power source 61 so as to stop the supply of the radio-frequency power. Further, in the fifth control, the controller MC controls the power supply unit 64 so as to stop the application of the DC voltage to the lower electrode 18. In addition, the gas supply may continuously supply the gas to the chamber 10 from the step ST1, or may stop the supply of the gas during the execution period of the step ST5.

Etching byproducts generated by the etching sequence ESQ may be left in the openings formed in the substrate W. When the step ST5 is executed, etching byproducts are discharged from the chamber 10 as gas, as illustrated in FIG. 6B. In FIG. 6B, a circle surrounding "B" represents an etching byproduct. In FIG. 5A, the symbol "+" in the substrate W indicates that the substrate W is charged with a positive charge.

In an embodiment, another sequence ASQ including one or more executions of the etching sequence ESQ and the step ST5 may be repeated. The repetition frequency of the sequence ASQ may be 100 Hz or more and 10 kHz or less. A ratio of one or more execution periods of the etching sequence ESQ in one execution period of the sequence ASQ may be 30% or more and 70% or less. In the embodiment, the controller MC repeatedly executes another control sequence. Another control sequence includes one or more executions of the etching control sequence and a fifth control. In the embodiment, as illustrated in FIG. 1, the method MT includes step STc. In the step STc, it is determined whether the stop condition is satisfied. In the step STc, it is determined whether the stop condition is satisfied. The stop condition is satisfied when the sequence ASQ (or another control sequence) is executed a predetermined number of times. When it is determined in the step STc that the stop condition is not satisfied, the sequence ASQ (or another control sequence) is executed again. Meanwhile, when it is determined in the step STc that the stop condition is satisfied, the method MT is ended.

In an embodiment, during one execution of the sequence ASQ, the step ST5 may be executed for 10 μsec or more. In the embodiment, the fifth control is executed for 10 μsec or more in the execution period of the other control sequence described above. In the embodiment, etching byproducts are more reliably discharged. As a result, the etching efficiency of the substrate is further improved.

In an embodiment, the time length of the execution period of the step ST5 may be increased as the number of executions of the sequence ASQ increases. In the embodiment, the controller MC may increase the time length of the execution period of the fifth control as the number of executions of the other control sequence increases. In the embodiment, as the depth of the opening formed in the substrate W increases, the time length of the execution period of the step ST5 is increased. Therefore, etching byproducts are more reliably discharged.

In an embodiment, radio-frequency power may be intermittently supplied from the radio-frequency power source 61 to generate plasma during the execution period of the step ST1, that is, in the period P1 and the period P2. That is, a plurality of pulses of radio-frequency power may be intermittently supplied from the radio-frequency power supply 61 during the execution period of the step ST1. In the embodiment, a plurality of pulses of radio-frequency power may be periodically supplied from the radio-frequency power supply source 61 during the execution period of the step ST1. The cycle in which the pulses of the radio-frequency power are supplied from the radio-frequency power source 61 may be a cycle defined by a frequency of 100 kHz or more and 1 MHz or less. In the embodiment, the power levels of the plurality of pulses of the radio-frequency power supplied from the radio-frequency power source 61 during the execution period of the step ST1 may vary. In the embodiment, an average value of the power levels of the plurality of pulses of the radio-frequency power supplied from the radio-frequency power source 61 during the execution period of the step ST1 may vary in the repetition of the etching sequence ESQ.

In an embodiment, a negative DC voltage may be intermittently applied from the power supply unit 64 to the lower electrode 18 during the execution period of the step ST2, that is, in the period P2. That is, a plurality of pulses of the negative DC voltage may be intermittently applied from the power supply unit 64 to the lower electrode 18 during the execution period of the step ST2. In the embodiment, a plurality of pulses of the negative DC voltage may be periodically applied from the power supply unit 64 to the lower electrode 18 during the execution period of the step ST2. The cycle in which the pulses of the negative DC voltage are applied from the power supply unit 64 to the lower electrode 18 may be a cycle defined by a frequency of 100 kHz or more and 1 MHz or less. The timing at which the pulses of the negative DC voltage are applied from the power supply unit 64 to the lower electrode 18 may be synchronized with the timing at which the pulses of the radio-frequency power are supplied from the radio-frequency power source 61. In the embodiment, the voltage values of a plurality of pulses of the negative DC voltage applied from the power supply unit 64 to the lower electrode 18 during the execution period of the step ST2 may vary. In the embodiment, an average value of the voltage values of a plurality of pulses of the negative DC voltage applied from the power supply unit 64 to the lower electrode 18 in the execution period of the step ST2 may vary in the repetition of the etching sequence ESQ.

In an embodiment, a positive DC voltage may be intermittently applied from the power supply unit 64 to the lower electrode 18 during the execution period of the step ST4, that is, in the period P4. That is, a plurality of pulses of the positive DC voltage may be intermittently applied from the power supply unit 64 to the lower electrode 18 during the execution period of the step ST4. In the embodiment, a plurality of pulses of the positive DC voltage may be periodically applied from the power supply unit 64 to the lower electrode 18 during the execution period of the step ST4. The cycle in which the pulses of the positive DC voltage are applied from the power supply unit 64 to the lower electrode 18 may be a cycle defined by a frequency of 100 kHz or more and 1 MHz or less. In the embodiment, the voltage values of a plurality of pulses of the positive DC voltage applied from the power supply unit 64 to the lower electrode 18 during the execution period of the step ST4 may vary. In the embodiment, an average value of the voltage values of a plurality of pulses of the positive DC voltage applied from the power supply unit 64 to the lower electrode 18 during the execution period of the step ST4 may vary in the repetition of the etching sequence ESQ.

Although various embodiments have been described above, the present disclosure is not limited to the embodiments described above, and various omissions, substitutions, and changes may be made. In addition, it is possible to combine the elements in other embodiments to form other embodiments.

For example, the plasma processing apparatus 1 is a capacitively coupled plasma processing apparatus, but the plasma processing apparatus according to another embodiment may be another type of plasma processing apparatus such as an inductively coupled plasma processing apparatus. Further, the method MT may be performed using any type of plasma processing apparatus other than the plasma processing apparatus 1, for example, an inductively coupled plasma processing apparatus.

According to an embodiment, the amount of positive charges on the substrate may be reduced and the etching efficiency may be increased.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method performed in a plasma processing apparatus, the etching method comprising:
   placing a substrate on a substrate support provided in a chamber of the plasma processing apparatus;
   supplying a radio-frequency power to generate plasma from a gas in the chamber;
   applying a negative DC voltage to the substrate support during the supplying of the radio-frequency power, thereby etching the substrate with positive ions from the plasma;
   for a predetermined period of time, providing each of the following conditions: stopping the applying of the negative DC voltage to the substrate support, not applying the positive DC voltage to the substrate support, and stopping the supplying of the radio-frequency power, thereby generating negative ions; and
   applying a positive DC voltage to the substrate support in a state where the supplying of the radio-frequency power is stopped, such that the negative ions are supplied to the substrate, thereby etching the substrate with the negative ions.

2. The method according to claim 1, further comprising:
   discharging a gas from an internal space of the chamber in a state where the supplying of the radio-frequency power is stopped and the applying of the positive DC voltage and the negative DC voltage to the substrate support is stopped after one or more executions of an etching sequence including the supplying of the radio-frequency power, the applying of the negative DC voltage, the stopping, and the applying of the positive DC voltage.

3. The method according to claim 2, wherein another sequence including the one or more executions of the etching sequence and the discharging is repeated.

4. The method according to claim 3, wherein the discharging is executed for 10 μsec or more in an execution period of the another sequence.

5. The method according to claim 3, wherein a time length of the execution period of the discharging is increased as a number of executions of the another sequence increases.

6. The method according to claim 1, wherein a parameter representing an electron density in the chamber is measured during execution of the stopping, and when determined from the parameter that the electron density in the chamber is decreased to satisfy a predetermined standard, the applying of the negative DC voltage is started.

7. The method according to claim 1, wherein in the stopping, the applying of the negative DC voltage to the substrate support is stopped before the supplying of the radio-frequency power is stopped.

8. The method according to claim 1, wherein in the supplying of the radio-frequency power, a plurality of pulses of the radio-frequency power are intermittently supplied to generate the plasma.

9. The method according to claim 1, wherein in the applying of the negative DC voltage, a plurality of pulses of the negative DC voltage are intermittently applied to the substrate support.

10. The method according to claim 1, wherein in the applying of the positive DC voltage, a plurality of pulses of the positive DC voltage are intermittently applied to the substrate support.

11. A plasma processing apparatus comprising:
a chamber;
a substrate support provided in the chamber;
a radio-frequency power source configured to supply radio-frequency power to generate plasma from a gas in the chamber;
a power supply electrically connected to the substrate support and configured to generate a positive DC voltage and a negative DC voltage; and
a controller configured to control the radio-frequency power source and the power supply,
wherein the controller is configured to execute:
a first control that controls the radio-frequency power source to supply the radio-frequency power to generate plasma from the gas in the chamber;
a second control that controls the power supply to apply the negative DC voltage to the substrate support during the supplying of the radio-frequency power, thereby etching a substrate with positive ions from the plasma;
a third control in which the controller controls the power supply and the radio-frequency power source to have each of the following conditions for a predetermined period of time: stopping the applying of the negative DC voltage to the substrate support, not applying the positive DC voltage to the substrate support, and stopping the supplying of the radio-frequency power, thereby generating negative ions; and
a fourth control that controls the power supply to apply the positive DC voltage to the substrate support in a state where the supplying of the radio-frequency power is stopped such that the negative ions are supplied to the substrate, thereby etching the substrate with the negative ions.

12. The apparatus according to claim 11, further comprising:
an exhaust device connected to the chamber,
wherein the controller is configured to further execute a fifth control that controls the exhaust device to exhaust a gas from an internal space of the chamber in a state where the supplying of the radio-frequency power is stopped and the applying of the positive DC voltage and the negative DC voltage to the substrate support is stopped after one or more executions of an etching control sequence including the first control, the second control, the third control, and the fourth control.

13. The apparatus according to claim 12, wherein the controller repeatedly executes another control sequence including one or more executions of the etching control sequence and the fifth control.

14. The apparatus according to claim 13, wherein the fifth control is executed for 10 μsec or more in an execution period of the another control sequence.

15. The apparatus according to claim 13, wherein the controller increases a time length of an execution period of the fifth control as a number of executions of the another control sequence increases.

16. The apparatus according to claim 11, further comprising:
a measuring device that measures a parameter representing an electron density in the chamber during execution of the third control,
wherein the controller starts execution of the fourth control when determined from the parameter that the electron density in the chamber is decreased to satisfy a predetermined standard.

17. The apparatus according to claim 11, wherein in the third control, the controller controls the power supply to stop the applying of the negative DC voltage to the substrate support before stopping the supplying of the radio-frequency power.

18. The apparatus according to claim 11, wherein in the first control, the controller controls the radio-frequency power source to intermittently supply a plurality of pulses of the radio-frequency power, thereby generating the plasma.

19. The apparatus according to claim 11, wherein in the second control, the controller controls the power supply to intermittently apply a plurality of pulses of the negative DC voltage to the substrate support.

20. The apparatus according to claim 11, wherein in the fourth control, the controller controls the power supply to intermittently apply a plurality of pulses of the positive DC voltage to the substrate support.

21. The apparatus according to claim 11, wherein the substrate support includes a lower electrode and an electrostatic chuck (ESC) provided on the lower electrode.

22. The apparatus according to claim 21, wherein the positive DC voltage and the negative DC voltage are applied to the lower electrode.

23. A plasma processing apparatus comprising:
a chamber;
a substrate support provided in the chamber;
a radio-frequency power source configured to supply radio-frequency power to generate plasma from a gas in the chamber;
a power supply electrically connected to the substrate support and configured to generate a positive DC voltage and a negative DC voltage; and
a controller configured to control the radio-frequency power source and the power supply,
wherein the controller is configured to execute:
a first control that controls the radio-frequency power source to supply the radio-frequency power to generate plasma from the gas in the chamber;
a second control that controls the power supply to apply the negative DC voltage to the substrate support during the supplying of the radio-frequency power, thereby etching a substrate with positive ions from the plasma;
a third control that controls the power supply and the radio-frequency power source to stop the applying of the negative DC voltage to the substrate support and the supplying of the radio-frequency power for a predetermined time period, thereby generating negative ions; and a fourth control that controls the power supply to apply the positive DC voltage to the substrate support in a state where the supplying of the radio-frequency power is stopped such that the negative ions are supplied to the substrate, thereby etching the substrate with the negative ions, wherein, in the third control, the controller is configured to stop the applying of the negative DC voltage to the substrate support before stopping the supplying of the radio-frequency power.

\* \* \* \* \*